(12) United States Patent
Huang

(10) Patent No.: US 12,154,650 B2
(45) Date of Patent: Nov. 26, 2024

(54) ELECTRONIC DEVICE AND POWER CONTROL METHOD THEREOF

(71) Applicant: Nuvoton Technology Corporation, Hsinchu Science Park (TW)

(72) Inventor: Chi-Ray Huang, Kaohsiung (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 168 days.

(21) Appl. No.: 18/084,902

(22) Filed: Dec. 20, 2022

(65) Prior Publication Data

US 2023/0206961 A1     Jun. 29, 2023

(30) Foreign Application Priority Data

Dec. 27, 2021   (TW) .................................. 110148843

(51) Int. Cl.
*G11C 5/14*      (2006.01)
*H03K 3/037*     (2006.01)

(52) U.S. Cl.
CPC ................. *G11C 5/148* (2013.01); *G11C 5/14* (2013.01); *H03K 3/037* (2013.01)

(58) Field of Classification Search
CPC ........... G11C 5/148; G11C 5/14; H03K 3/037
See application file for complete search history.

(56) References Cited

U.S. PATENT DOCUMENTS

| 7,023,761 | B1 * | 4/2006 | Tran ......................... | G11C 5/14 |
| | | | | 365/229 |
| 8,325,511 | B2 * | 12/2012 | Seshadri ............... | G11C 11/417 |
| | | | | 365/189.11 |
| 8,331,188 | B2 * | 12/2012 | Nakaoka ................ | G11C 5/147 |
| | | | | 365/228 |
| 9,160,312 | B2 * | 10/2015 | Lemkin ................. | G11C 11/417 |
| 2011/0273951 | A1 | 11/2011 | Li et al. | |
| 2013/0257500 | A1 | 10/2013 | Lemkin | |

* cited by examiner

*Primary Examiner* — Son L Mai
(74) *Attorney, Agent, or Firm* — MUNCY, GEISSLER, OLDS & LOWE, P.C.

(57) ABSTRACT

An electronic device includes at least two logic circuits, at least two memories, and at least two power switches. The logic circuits are stacked on each other and electrically connected to each other, and they are electrically connected between a power source and a ground. The memories are stacked on each other and electrically coupled to each other, and they are electrically connected between the power source and the ground. The power switches are connected in series between the respective logic circuits and the respective memories. The power switches cut off or maintain the electrical connection between the logic circuits and between the memories, according to a control signal.

19 Claims, 4 Drawing Sheets

ELECTRONIC DEVICE AND POWER CONTROL METHOD THEREOF

CROSS REFERENCE TO RELATED APPLICATIONS

This application claims the benefit of Taiwan Application No. 110148843, filed on Dec. 27, 2021, the entirety of which is incorporated by reference herein.

BACKGROUND OF THE INVENTION

Field of the Invention

The present invention relates to an electronic device, and, in particular, to an electronic device with a power control function and a power control method thereof.

Description of the Related Art

When a system is in a sleep mode, parts of the circuits in the system are disconnected from the power source, and other parts of the circuits (those with power, which are called active regions) are used to store data that cannot be lost. The main methods of reducing power consumption due to leakage current in the active regions are by transistor stacking, body biasing, and decreasing the supply voltage. The method of decreasing the supply voltage reduces the current flow by reducing the terminal voltage of the logic gate. However, this method reduces the power of the voltage regulator, because the greater the voltage difference between the output and input of the voltage regulator, the greater the power loss.

Transistor stacking reduces the current flow by having more transistors in series with a higher equivalent resistance. However, transistor stacking requires more logic gate area. The body biasing technology is to increase (or decrease) the body bias of the transistor, resulting in a higher threshold voltage in the transistor, which reduces the current. However, the body biasing technology requires a separate substrate, so that the logic gate area increases accordingly.

BRIEF SUMMARY OF THE INVENTION

An embodiment of the present invention provides an electronic device. The electronic device includes at least two logic circuits, at least two memories, and at least two power switches. The logic circuits are stacked on each other and electrically connected to each other, and they are electrically connected between a power source and ground. The memories are stacked on each other and electrically coupled to each other, and they are electrically connected between the power source and the ground. The power switches are connected in series between the respective logic circuits and the respective memories. The power switches cut off or maintain the electrical connection between the logic circuits and between the memories according to a control signal.

The electronic device further includes a voltage regulator. The voltage regulator converts an external voltage into the voltage of the power source.

According to the electronic device described above, each of the power switches includes a first switch, a second switch and a third switch. The first switch is electrically connected between one of the logic circuits and the ground or between one of the memories and the ground. The second switch is electrically connected between the other logic circuit and the power source or between the other memory and the power source. The third switch is electrically connected between the logic circuit and the other logic circuit, or between the memory and the other memory.

According to the electronic device described above, the logic circuit and the memory are electrically connected to the power source. The other logic circuit and the other memory are electrically connected to the ground.

According to the electronic device described above, the first switch electrically connects the logic circuit or the memory to the ground according to the reverse signal of the control signal.

According to the electronic device described above, the second switch electrically connects the other logic circuit or the other memory to the power source according to the control signal.

According to the electronic device described above, the third switch electrically connects the logic circuit to the other logic circuit, or it electrically connects the memory to the other memory.

According to the electronic device described above, the first switch includes an n-type transistor. When the reverse signal of the control signal is at a logic low level, the n-type transistor turns on, so that the logic circuit or the memory is electrically connected to the ground.

According to the electronic device described above, the second switch includes a p-type transistor. When the control signal is at a logic high level, the p-type transistor turns on, so that the other logic circuit or the other memory is electrically connected to the power source.

According to the electronic device described above, the third switch includes a p-type transistor and an n-type transistor. The source of the p-type transistor is electrically connected to the drain of the n-type transistor. The source of the p-type transistor and the drain of the n-type transistor are commonly electrically connected to the logic circuit or the memory. The drain of the p-type transistor is electrically connected to the source of the n-type transistor. The drain of the p-type transistor and the source of the n-type transistor are commonly electrically connected to the other logic circuit or the other memory.

According to the electronic device described above, when the control signal is at the logic high level, and the reverse signal of the control signal is at the logic low level, the p-type transistor and the n-type transistor both turn on.

According to the electronic device described above, the minimum data retention voltage of each of the logic circuits is lower than that of each of the memories.

According to the electronic device described above, the maximum number of logic circuits electrically coupled in the logic circuits is more than the maximum number of memories electrically coupled in the memories.

According to the electronic device described above, each of the power switches further includes an inverter; the inverter converts the control signal into the reverse signal of the control signal.

The present invention also provides a method for power control. The method is applicable to at least two logic circuits and at least two memories that are electrically connected between a power source and a ground and are stacked on each other and electrically coupled to each other. The method includes receiving a control signal; electrically connecting the logic circuits and electrically connecting the memories when the control signal is at a logic high level; and cutting off the electrical connection between the logic circuits and cutting off the electrical connection between the memories when the control signal is at a logic low level.

According to the method described above, one of the logic circuits and one of the memories are electrically connected to the power source, and the other logic circuit and the other memory are electrically connected to the ground.

The method further includes electrically connecting the logic circuit and the memory to the ground and electrically connecting the other logic circuit and the other memory to the power source when the control signal is at the logic low level.

The method further includes cutting off the electrical connection between the logic circuit and the ground, cutting off the electrical connection between the memory and the ground, cutting off the electrical connection between the other logic circuit and the power source, and cutting off the electrical connection between the other memory and the power source when the control signal is at the logic high level.

The method further includes converting the control signal into the reverse signal of the control signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
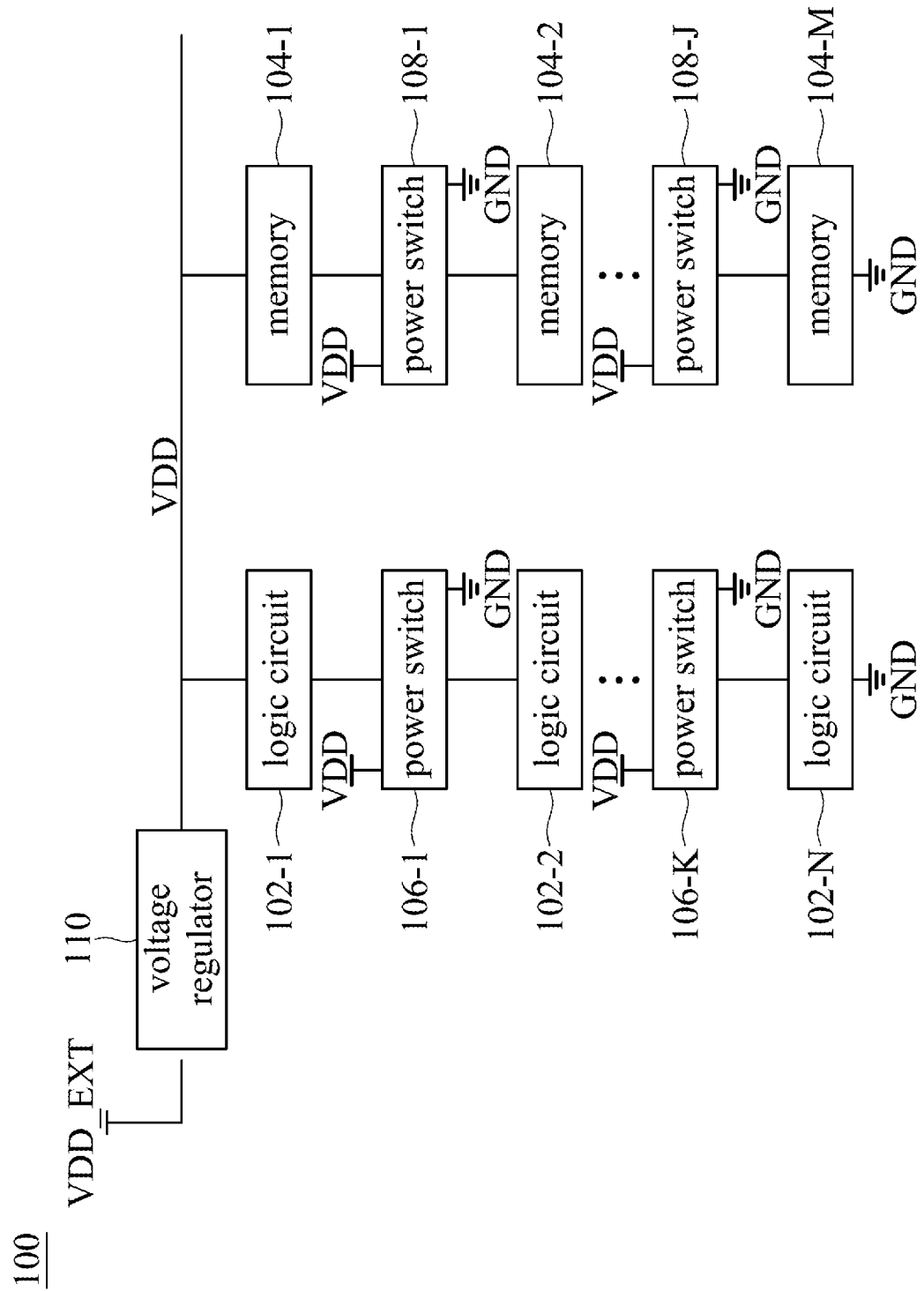
FIG. 1 is a schematic diagram of an electronic device 100 in accordance with some embodiments of the present invention.

FIG. 1 is a schematic diagram of an electronic device 100 in accordance with some embodiments of the present invention. As shown in FIG. 1, the electronic device 100 includes at least two logic circuits (for example, logic circuits 102-1, 102-2, ..., 102-N), at least two memories (for example, memories 104-1, 104-2, ..., 104-M), at least two power switches (for example, power switches 106-1, ..., 106-K, and power switches 108-1, ..., 108-J), and a voltage regulator 110.

The logic circuits are electrically connected between a power source VDD and a ground GND. In some embodiments, the logic circuits 102-1, 102-2, ..., 102-N are stacked on each other and electrically coupled to each other. The power switches 106-1, ..., 106-K are connected in series between the respective logic circuits 102-1, 102-2, ..., and 102-N. For example, the logic circuit 102-1 is electrically connected between the power source VDD and the power switch 106-1. The power switch 106-1 is electrically connected between the logic circuit 102-1 and the logic circuit 102-2. The logic circuit 102-2 is electrically connected between the power switch 106-2 and the power switch 106-1. The power switch 106-K is electrically connected between the logic circuit 102-(N−1) and the logic circuit 102-N. The logic circuit 102-N is electrically connected between the power switch 106-K and the ground GND. K and N are positive integers.

Since there is a power switch (for example, the power switch 106-1) between two adjacent logic circuits (for example, the logic circuits 102-1 and 102-2), the number of the power switches 106-1, ..., 106-K may be less than the number of logic circuits. In other words, K is equal to N−1. In some embodiments, each of the power switches 106-1, ..., 106-K is electrically connected between the power source VDD and the ground GND, and is able to cut off or maintain the electrical connection between the logic circuits 102-1, 102-2, ..., and 102-N according to a control signal.

In some embodiments, the logic circuits 102-1, 102-2, ..., 102-N may be all or partially identical logic circuits. For example, the logic circuits 102-1, 102-2, ..., 102-N may all be multipliers. Alternatively, the logic circuit 102-1 may be an adder, the logic circuit 102-2 may be an inverter, and the logic circuit 102-N may be a NOR gate, but the present invention is not limited thereto.

The memories are electrically connected between the power source VDD and the ground GND. In some embodiments, the memories 104-1, 104-2, ..., 104-M are stacked on each other and electrically coupled to each other. The power switches 108-1, ..., 108-J are connected in series between the respective memories 104-1, 104-2, ..., 104-M. For example, the memory 104-1 is electrically connected between the power source VDD and the power switch 108-1. The power switch 108-1 is electrically connected between the memory 104-1 and the memory 104-2. The memory 104-2 is electrically connected between the power switch 108-1 and the power switch 108-2. The power switch 108-J is electrically connected between the memory 104-(M−1) and the memory 104-M. The memory 104-M is electrically connected between the power switch 108-J and the ground GND. M and J are positive integers.

Since there is a power switch (for example, the power switch 108-1) between two adjacent memories (for example, the memories 104-1 and 104-2), the number of the power switches 108-1, ..., 108-J may be less than the number of memories. In other words, M is equal to J−1. In some embodiments, each of the power switches 108-1, ..., 108-J is electrically connected between the power source VDD and the ground GND, and is able to cut off or maintain the electrical connection between the memories 104-1, 104-2, ..., 104-M.

In some embodiments, the memories 104-1, 104-2, ..., 104-M may be different storage blocks within the same memory, or may be different memories. For example, the memory 104-1 may be the first memory array of a main memory in the system, and the memory 104-2 may be the second memory array. Alternatively, the memory 104-1 may be the primary memory in the system, and the memory 104-2 may be the secondary memory in the system. In some embodiments, the memories 104-1, 104-2, ..., 104-M may be volatile memories or non-volatile memories. The voltage regulator 110 is used for converting an external voltage VDD EXT into the power source VDD.

Figure 2:
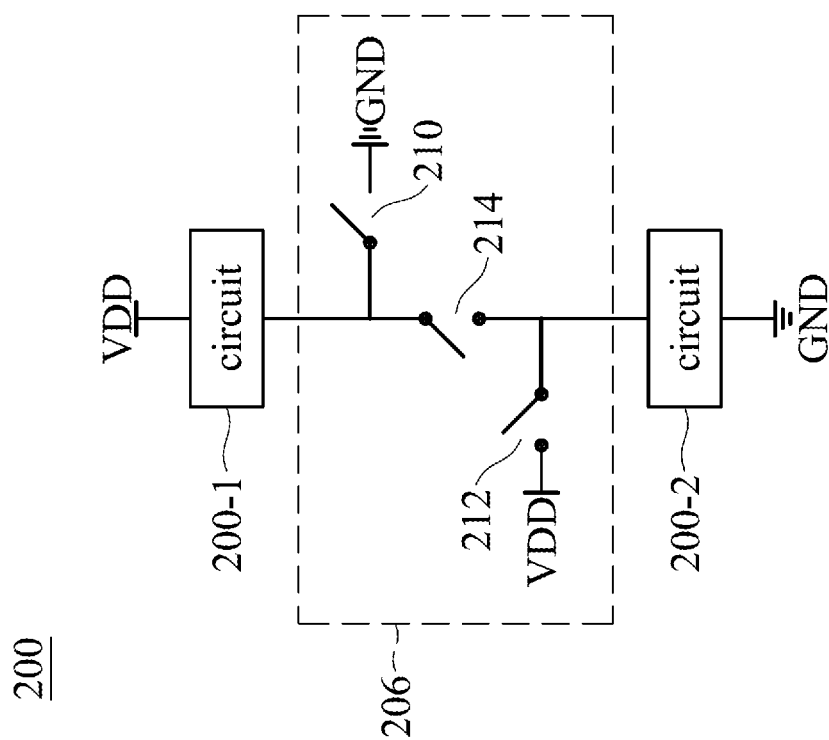
FIG. 2 is a schematic diagram of an electronic device 200 and its power switch 206 in accordance with some embodiments of the present invention.

FIG. 2 is a schematic diagram of an electronic device 200 and its power switch 206 in accordance with some embodiments of the present invention. As shown in FIG. 2, the electronic device 200 includes a circuit 200-1, a circuit 200-2, and the power switch 206. The circuit 200-1 is electrically connected between the power source VDD and the power switch 206. The power switch 206 is electrically connected between the circuit 200-1 and the circuit 200-2. The circuit 200-2 is electrically connected between the power switch 206 and the ground GND. In some embodiments, the circuit 200-1 and the circuit 200-2 may be the logic circuits and the memories in FIG. 1. For example, the circuit 200-1 and the circuit 200-2 may be intellectual property cores or arithmetic units.

The power switch 206 includes a switch 210, a switch 212, and a switch 214. The switch 210 is electrically connected between the circuit 200-1 and the ground GND, and is able to connect the circuit 200-1 to the ground GND according to the control signal. The switch 212 is electrically connected between the circuit 200-2 and the power source VDD, and is able to connect the circuit 200-2 to the power source VDD according to the control signal. The switch 214 is electrically connected between the circuit 200-1 and the circuit 200-2, and is able to connect the circuit 200-1 to the circuit 200-2 according to the control signal.

Figure 3:
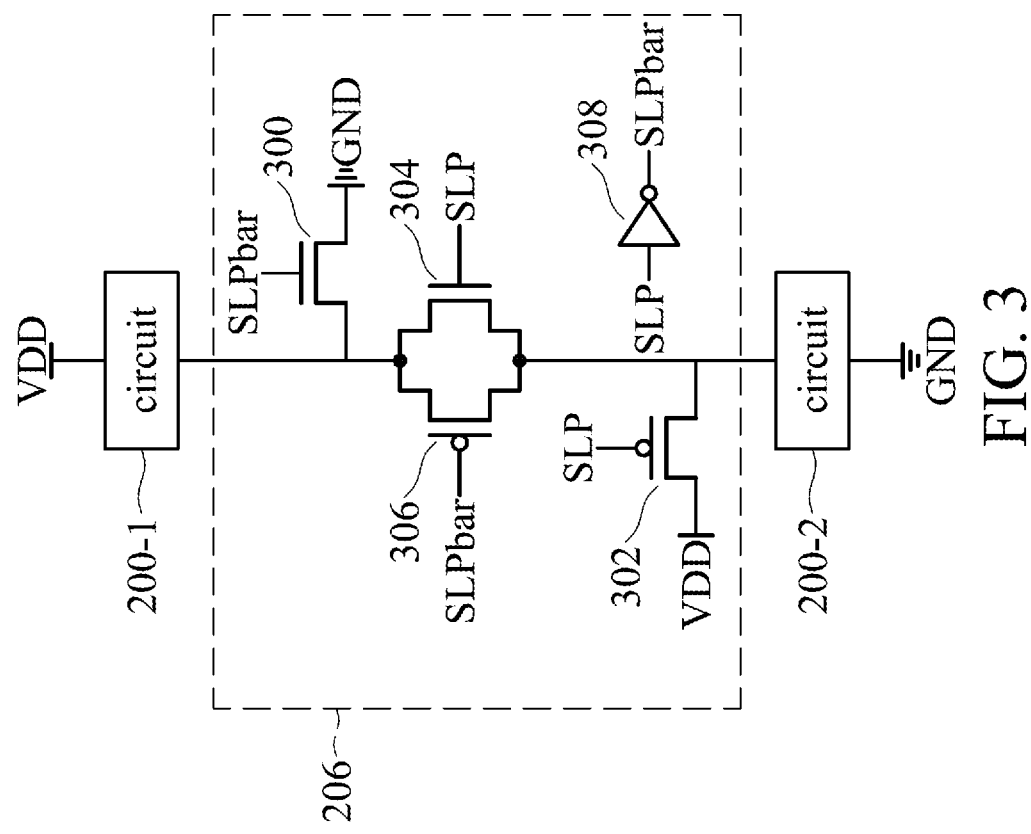
FIG. 3 is a detail schematic diagram of the device 200 and its power switch 206 in FIG. 2 in accordance with some embodiments of the present invention.

FIG. 3 is a detail schematic diagram of the device 200 and its power switch 206 in FIG. 2 in accordance with some embodiments of the present invention. The configurations of the circuit 200-1, the circuit 200-2, and the power switch 206 in FIG. 3 are the same as those in FIG. 2, and thus will not be described again. Refer to FIG. 2 and FIG. 3 at the same time. The switch 210 includes an n-type transistor 300. The switch 212 includes a p-type transistor 302. The switch 214 includes an n-type transistor 304 and a p-type transistor 306. The power switch 206 further includes an inverter 308 to convert a control signal SLP to a reverse signal SLPbar.

In some embodiments, when the electronic devices 100 and 200 are in the sleep mode (or the standby mode), the control signal SLP is at a logic high level, and the reverse signal SLPbar is at a logic low level. In contrast, when the electronic devices 100 and 200 are in the normal mode (or the working mode), the control signal SLP is at the logic low level, and the reverse signal SLPbar is at the logic high level.

As shown in FIG. 3, the gate of the n-type transistor 300 is connected to the reverse signal SLPbar, the source of the n-type transistor 300 is connected to the ground GND, and the drain of the n-type transistor 300 is connected to the circuit 200-1. When the reverse signal SLPbar is at the logic high level (that is, the normal mode), the n-type transistor 300 turns on, so that the circuit 200-1 is electrically connected to the ground GND. At this time, since the circuit 200-1 is electrically connected between the power source VDD and the ground GND to form a loop, the circuit 200-1 is able to operate independently in the normal mode.

The gate of the p-type transistor 302 is connected to the control signal SLP. The source of the p-type transistor 302 is connected to the power source VDD. The drain of the p-type transistor 302 is connected to the circuit 200-2. When the control signal SLP is at the logic low level (that is, the normal mode), the p-type transistor 302 turns on, so that the circuit 200-2 is electrically connected to the power source VDD. At this time, since the circuit 200-2 is electrically connected between the power source VDD and the ground GND to form a loop, the circuit 200-2 is able to operate independently in the normal mode.

The gate of the n-type transistor 304 is connected to the control signal SLP. The source of the n-type transistor 304 is connected to the drain of the p-type transistor 306 and the circuit 200-2. The drain of the n-type transistor 304 is connected to the source of the p-type transistor 306 and the reverse signal SLPbar. When the control signal SLP is at the logic low level, and the reverse signal SLPbar is at the logic high level (that is, the normal mode), the n-type transistor 304 and the p-type transistor 306 both do not turn on, the electrical connection between the circuit 200-1 and the circuit 200-2 is cut off, so that the circuit 200-1 and the circuit 200-2 are able to operate independently in the normal mode.

In contrast, when the control signal SLP is at the logic high level, and the reverse signal SLPbar is at the logic low level (that is, the sleep mode), the n-type transistor 304 and the p-type transistor 306 both turn on to electrically connect the circuit 200-1 to the circuit 200-2. At the same time, the n-type transistor 300 turns off, so that the electrical connection between the circuit 200-1 and the ground GND is cut off. At the same time, the p-type transistor 302 turns off, so that the electrical connection between the circuit 200-2 and the power source VDD is cut off.

In some embodiments of FIG. 3, in the sleep mode, since the circuits 200-1 and 200-2 are connected in series between the power source VDD and the ground GND, the standby voltages of the circuits 200-1 and 200-2 are both ½*VDD, so that the purpose of reducing the power consumption caused by the leakage current is achieved.

Refer to FIG. 1 and FIG. 3 at the same time. The minimum data retention voltage of each of the logic circuits 102-1, 102-2, . . . , 102-N is lower than that of each of the memories 104-1, 104-2, . . . , 104-M. For example, the minimum data retention voltage of each of the logic circuits 102-1, 102-2, . . . , 102-N is lower than ⅓*VDD. The present invention may set N as 3, so that the logic circuits 102-1, 102-2 and 102-3 are still able to store the required data in the sleep mode.

The minimum data retention voltage of each of the memories 104-1, 104-2, . . . , 104-M is lower than ½*VDD. The present invention may set M as 2, so that the memories 104-1 and 104-2 are still able to store the required data in the sleep mode. Therefore, the maximum number of logic circuits electrically coupled in the logic circuits 102-1, 102-2, . . . , 102-N is more than that of memories electrically coupled in the memories 104-1, 104-2, . . . , 104-M. In other words, N is larger than M.

Figure 4:
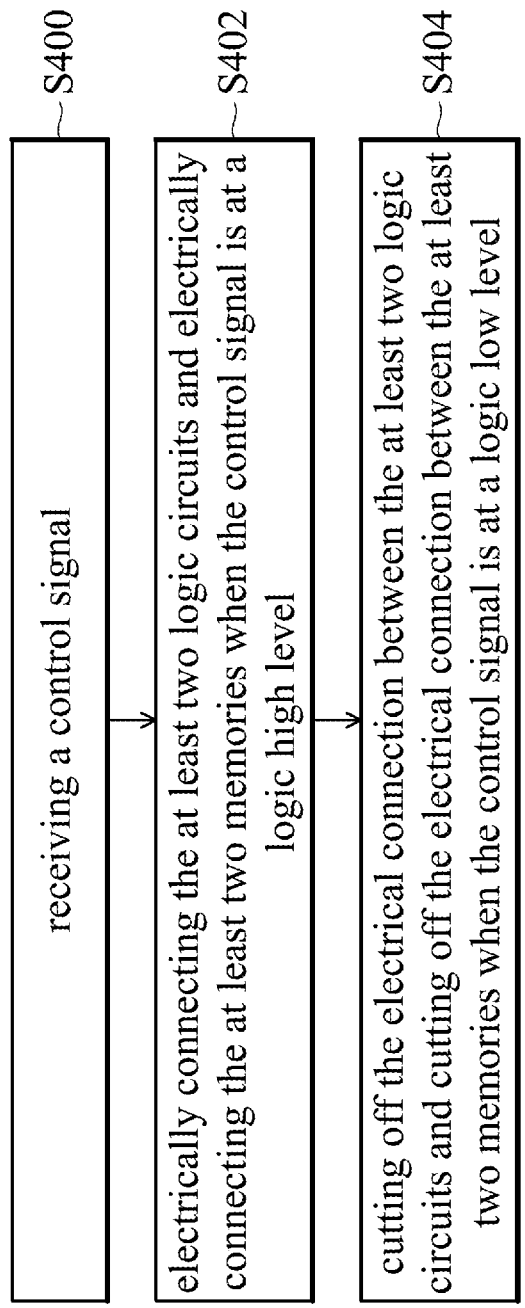
FIG. 4 is a flow chart of a method for power control in accordance with some embodiments of the present invention.

FIG. 4 is a flow chart of a method for power control in accordance with some embodiments of the present invention. As shown in FIG. 4, the method for power control of the present invention includes receiving a control signal (for example, the control signal SLP in FIG. 3)(step S400); electrically connecting the logic circuits (for example, the logic circuits 102-1, 102-2, . . . , 102-N in FIG. 1) and electrically connecting the memories (for example, the memories 104-1, 104-2, . . . , 104-M in FIG. 1) when the control signal is at a logic high level (step S402); and cutting off the electrical connection between the logic circuits and cutting off the electrical connection between the memories when the control signal is at a logic low level (step S404).

In some embodiments, the power switches 106-1, . . . , 106-K and the power switches 108-1, . . . , 108-J in FIG. 1, and the power switch 206 in FIGS. 2 and 3 execute steps S400, S402 and S404 in FIG. 4. In step S400, the inverter 306 included in the power switch 206 converts the control signal (for example, the control signal SLP) to the reverse signal of the control signal (for example, the reverse signal SLPbar).

When step S402 is applied to the embodiments of FIG. 2 and FIG. 3, the power switch 206 (or n-type transistor 300) further cuts off the electrical connection between the circuit 200-1 and the ground GND, and the power switch 206 (or p-type transistor 302) also cuts off the electrical connection between the circuit 200-2 and the power source VDD.

When step S404 is applied to the embodiments of FIG. 2 and FIG. 3, the power switch 206 (or n-type transistor 300) further electrically connects the circuit 200-1 to the ground GND, and the power switch 206 (or p-type transistor 302) also electrically connects the circuit 200-2 to the power source VDD.

The electronic device 100 and the electronic device 200 of the present invention can equivalently achieve the effect of the transistor stacking technology, thereby reducing the logic gate area. Since the output voltage of the voltage regulator 110 is still maintained at the voltage of the power source VDD, the electronic device 100, the electronic device 200, and the method for power control of the present invention can simultaneously reduce the power consumption of the voltage regulator (for example, the voltage regulator 110). The purpose of the present invention is to take the data retention voltage as the design orientation. A separate stack structure and a stack structure switching mechanism are proposed, so that the total leakage current of the system may be minimized and the system can operate at full speed in the normal mode.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   at least two logic circuits, stacked on each other and electrically coupled to each other, and electrically connected between a power source and a ground;
   at least two memories, stacked on each other and electrically coupled to each other, and electrically connected between the power source and the ground;
   at least two power switches, respectively connected in series between the at least two logic circuits and the at least two memories;
   wherein the at least two power switches cut off or maintain the electrical connection between the at least two logic circuits and between the at least two memories, according to a control signal.

2. The electronic device as claimed in claim 1, further comprising a voltage regulator, wherein the voltage regulator converts an external voltage into the voltage of the power source.

3. The electronic device as claimed in claim 1, wherein each of the at least two power switches comprises:
   a first switch, electrically connected between one of the at least two logic circuits and the ground or between one of the at least two memories and the ground;
   a second switch, electrically connected between other one of the at least two logic circuits and the power source or between other one of the at least two memories and the power source;
   a third switch, electrically connected between the one of the at least two logic circuits and the other one of the at least two logic circuits, or between the one of the at least two memories and the other one of the at least two memories.

4. The electronic device as claimed in claim 3, wherein the one of the at least two logic circuits and the one of the at least two memories are electrically connected to the power source, and the other one of the at least two logic circuits and the other one of the at least two memories are electrically connected to the ground.

5. The electronic device as claimed in claim 4, wherein the first switch electrically connects the one of the at least two logic circuits or the one of the at least two memories to the ground according to a reverse signal of the control signal.

6. The electronic device as claimed in claim 4, wherein the second switch electrically connects the other one of the at least two logic circuits or the other one of the at least two memories to the power source according to the control signal.

7. The electronic device as claimed in claim 4, wherein the third switch electrically connects the one of the at least two logic circuits to the other one of the at least two logic circuits, or electrically connects the one of the at least two memories to the other one of the at least two memories.

8. The electronic device as claimed in claim 5, wherein the first switch comprises an n-type transistor; when the reverse signal of the control signal is at a logic low level, the n-type transistor turns on, so that the one of the at least two logic circuits or the one of the at least two memories is electrically connected to the ground.

9. The electronic device as claimed in claim 6, wherein the second switch comprises a p-type transistor; when the control signal is at a logic high level, the p-type transistor turns on, so that the other one of the at least two logic circuits or the other one of the at least two memories is electrically connected to the power source.

10. The electronic device as claimed in claim 7, wherein the third switch comprises a p-type transistor and an n-type transistor; the source of the p-type transistor is electrically connected to the drain of the n-type transistor, and the source of the p-type transistor and the drain of the n-type transistor are both electrically connected to the one of the at least two logic circuits or the one of the at least two memories; the drain of the p-type transistor is electrically connected to the source of the n-type transistor, and the drain of the p-type transistor and the source of the n-type transistor are both electrically connected to the other one of the at least two logic circuits or the other one of the at least two memories.

11. The electronic device as claimed in claim 10, wherein when the control signal is at the logic high level, and the reverse signal of the control signal is at the logic low level, the p-type transistor and the n-type transistor both turn on.

12. The electronic device as claimed in claim 1, wherein a minimum data retention voltage of each of the at least two logic circuits is lower than that of each of the at least two memories.

13. The electronic device as claimed in claim 12, wherein a maximum number of logic circuits electrically coupled in the at least two logic circuits is more than that of memories electrically coupled in the at least two memories.

14. The electronic device as claimed in claim 1, wherein each of the at least two power switches further comprises an inverter; the inverter converts the control signal into the reverse signal of the control signal.

15. A method for power control, applicable to at least two logic circuits and at least two memories that are electrically connected between a power source and a ground and are stacked on each other and electrically coupled to each other, comprising:
   receiving a control signal;
   electrically connecting the at least two logic circuits and electrically connecting the at least two memories when the control signal is at a logic high level; and cutting off the electrical connection between the at least two logic circuits and cutting off the electrical connection between the at least two memories when the control signal is at a logic low level.

16. The method as claimed in claim 15, wherein one of the at least two logic circuits and one of the at least two memories are electrically connected to the power source, and other one of the at least two logic circuits and other one of the at least two memories are electrically connected to the ground.

17. The method as claimed in claim 16, further comprising:
electrically connecting the one of the at least two logic circuits and the one of the at least two memories to the ground and electrically connecting the other one of the at least two logic circuits and the other one of the at least two memories to the power source when the control signal is at the logic low level.

18. The method as claimed in claim 16, further comprising:
cutting off the electrical connection between the one of the at least two logic circuits and the ground, cutting off the electrical connection between the one of the at least two memories and the ground, cutting off the electrical connection between the other one of the at least two logic circuits and the power source, and cutting off the electrical connection between the other one of the at least two memories and the power source when the control signal is at the logic high level.

19. The method as claimed in claim 16, further comprising:
converting the control signal into the reverse signal of the control signal.

\* \* \* \* \*